(12) United States Patent
Liebau et al.

(10) Patent No.: US 6,998,837 B2
(45) Date of Patent: Feb. 14, 2006

(54) SERIAL COMMUNICATION TESTING (75) Inventors: Henrik Liebau, Stuttgart (DE); Thomas Dippon, Gaertringen (DE)

(73) Assignee: Agilent Technologies, Inc., Palo Alto, CA (US)

( * ) Notice: Subject to any disclaimer, the term of this patent is extended or adjusted under 35 U.S.C. 154(b) by 89 days.

(21) Appl. No.: 10/679,599

(22) Filed: Oct. 6, 2003

(65) Prior Publication Data

US 2005/0062462 A1  Mar. 24, 2005

(30) Foreign Application Priority Data

Apr. 10, 2003 (EP) .................................. 03100960

(51) Int. Cl.
*G01R 31/26* (2006.01)
*G01R 31/28* (2006.01)
(52) U.S. Cl. .................... 324/158.1; 324/765; 714/724
(58) Field of Classification Search ............. 324/158.1, 324/765; 714/724
See application file for complete search history.

(56) References Cited

U.S. PATENT DOCUMENTS

| | | | |
|---|---|---|---|
| 4,760,330 A | 7/1988 | Lias, Jr. ....................... 324/73 |
| 5,477,544 A | 12/1995 | Botelho ...................... 371/20.1 |
| 6,023,358 A | 2/2000 | Baney ......................... 359/110 |
| 6,466,047 B1 | 10/2002 | Doherty et al. ............. 324/765 |
| 2003/0196151 A1 * | 10/2003 | Evans ......................... 714/724 |
| 2004/0111657 A1 * | 6/2004 | Choi .......................... 714/724 |

* cited by examiner

*Primary Examiner*—Vinh Nguyen
*Assistant Examiner*—Emily Y Chan (57) ABSTRACT

A coupling unit provides a signal path between at least two of: a first device under test (DUT), and first and second couplers. The first coupler is coupled to a signal analyzer. The second coupler is coupled to another DUT. Both couplers provide and receive signals to and from the coupling unit which includes first and second multiplexers. An output of the first DUT is coupled to a first input of the first multiplexer and to a first input of the first coupler. A first output of the first coupler is coupled to a second input of the first multiplexer. The output of the first multiplexer is coupled to the input of the second coupler. The output of the second coupler is coupled to a first input of the second multiplexer and to a second input of the first coupler. A second output of the first coupler is coupled to a second input of the second multiplexer. The output of the second multiplexer is coupled to an input of the first DUT.

10 Claims, 8 Drawing Sheets

SERIAL COMMUNICATION TESTING

BACKGROUND OF THE INVENTION

1. Field of the Invention

The present invention is directed to a coupling unit for providing at least one signal path between at least two of a device under test, a first coupler, and a second coupler.

2. Brief Description of Related Developments

For testing a serial communication, a signal analyzer is usually coupled to a device under test or between two devices under test providing such serial communication.

SUMMARY OF THE INVENTION

It is an object of the present invention to facilitate an improved testing of serial communication. The object is solved by the independent claims. Preferred embodiments are shown by the dependent claims.

The coupling unit according to the present invention allows testing a serial communication of one of the first and second DUT as well as between the two DUTs, as far as coupled to the respective couplers, without having to change the connections between the analyzer and the first and second DUTs. This allows a fast and comfortable testing of various options and types of connections in the serial communication without requiring changing the connections during testing.

Without being limited thereto, the invention has been proved to be in particular useful for Gigabit range applications (e.g. 2.5 GB/s).

It goes without saying that the invention is in particular useful for automated testing, e.g. where an operator might not be present or acts from a remote location.

The term unidirectional serial communication as used herein can be defined as a connection between two devices where information flows in one direction of this connection only. For high-speed serial communication links, this connection might consist of one or more parallel connections, such as differential pairs.

A point-to-point link, as can used herein, can be defined as two unidirectional serial communication links between two devices, each in opposite direction. Such point-to-point link might be used for providing bi-directional communication.

The invention can be partly or entirely embodied or supported by one or more suitable software programs, which can be stored on or otherwise provided by any kind of data carrier, and which might be executed in or by any suitable data processing unit.

BRIEF DESCRIPTION OF THE DRAWINGS

Other objects and many of the attendant advantages of the present invention will be readily appreciated and become better understood by reference to the following detailed description when considering in connection with the accompanied drawing(s). Features that are substantially or functionally equal or similar will be referred to with the same reference sign(s).

DETAILED DESCRIPTION OF EMBODIMENTS OF THE INVENTION

Figure 1:
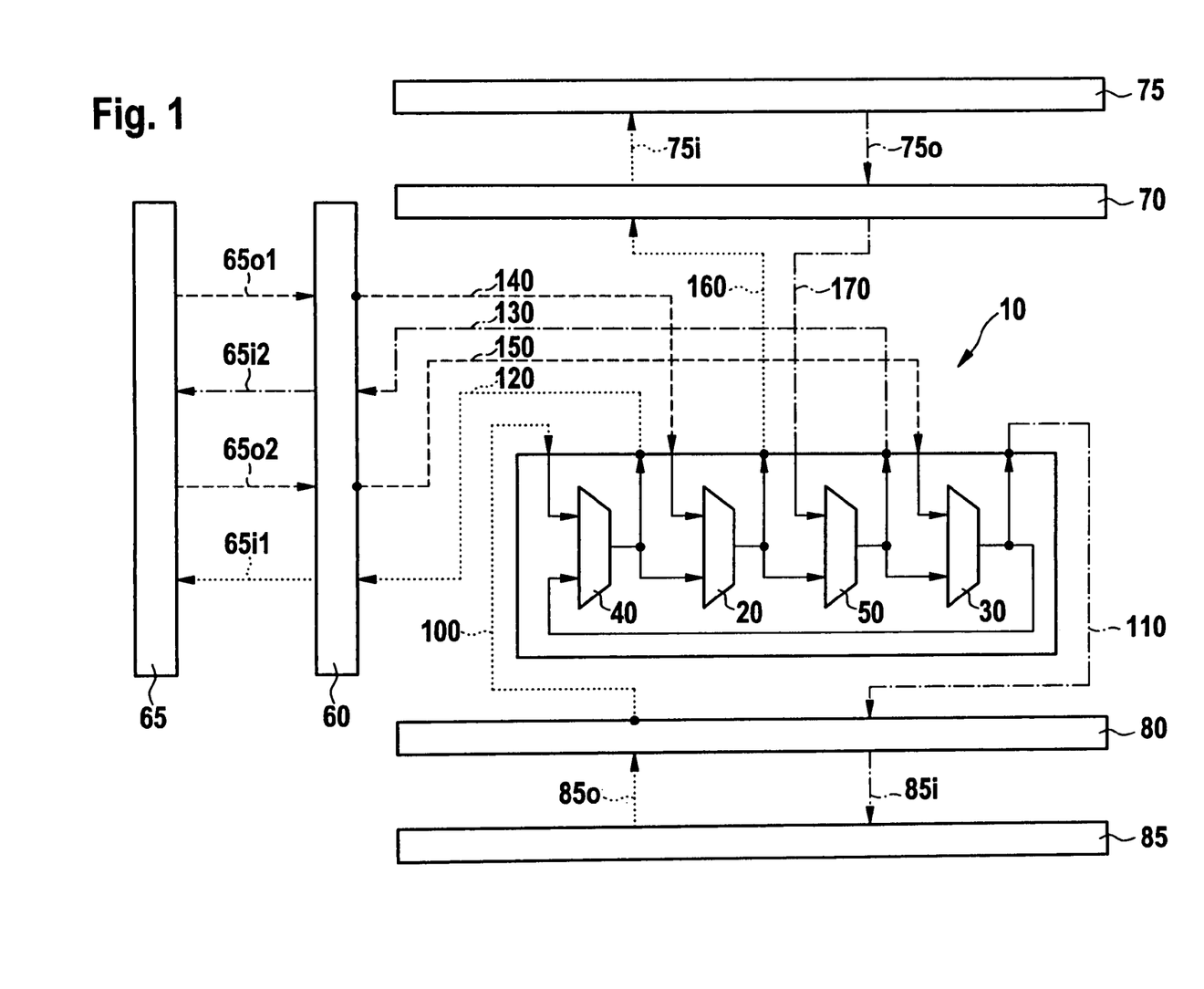
FIG. 1 illustrates the principle architecture of an embodiment of the present invention.

In FIG. 1, a coupling unit 10 comprises a first multiplexer 20, a second multiplexer 30, a third multiplexer 40 and a fourth multiplexer 50. It is to be understood that the third and fourth multiplexers 40 and 50 are optional, and the deviations in the architecture of FIG. 1 without the third and fourth multiplexers 40 and 50 will be explained later on with reference to FIG. 8.

The coupling unit 10 allows providing various signal paths between a first coupler 60, a second coupler 70, and a third coupler 80. The term signal path, as used herein, can be defined as a path between two ends adapted to transmit electrical signals between the two ends.

An output 85$o$ of a first device under test (DUT) 85 can be coupled to an output line 100 coupled to the third coupler 80, and an input 85$i$ of the first DUT 85 can be coupled to an input line 110 also coupled to the third coupler 80.

An analyzer 65 can be coupled to the first coupler 60 with a first input line 65$i$1 coupling to an input line 120, a second input 65$i$2 coupling to an input line 130, a first output line 65$o$1 coupling to an output line 140, and a second output line 65$o$2 coupling to an output line 150.

A second DUT 75 can be coupled to the second coupler 70 with an input 75$i$ coupling to a line 160 and an output 75$o$ coupling to line 170.

Each of the multiplexers 20 to 50 receives two inputs and can select one of those inputs as its output.

Figure 8:
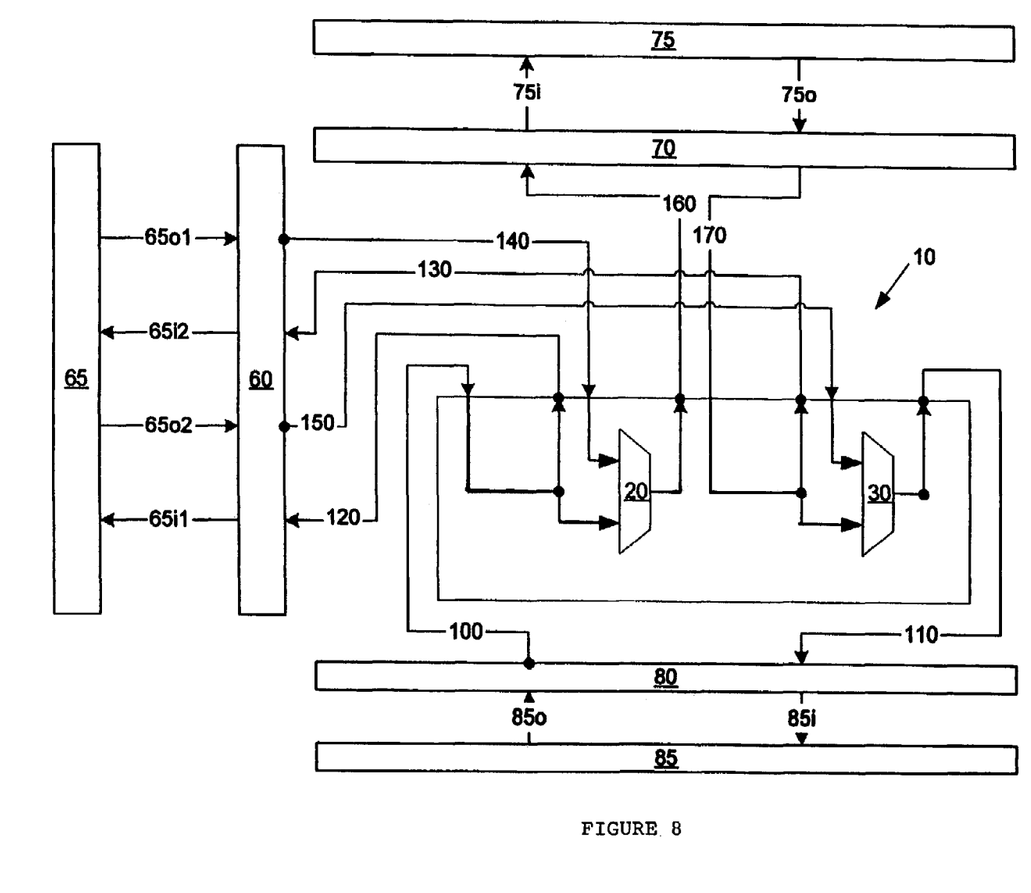

The third multiplexer 40 receives as inputs the line 100 as well as a feedback line 180. The output of the third multiplexer 40 is coupled to the line 120 as well as to the first input of the first multiplexer. In case the optional third multiplexer 40 is omitted, the line 100 is directly coupled to the line 120 as well as to the first input of the first multiplexer 20 as shown in FIG. 8.

The first multiplexer 20 receives as second input the line 140, and its output is coupled to the line 160 and to a first input of the fourth multiplexer 50.

The fourth multiplexer 50 receives as second input the line 170, and its output is coupled to the line 130 as well as to a first input of the second multiplexer 30. In case the optional fourth multiplexer 50 is omitted the line 170 is directly coupled to the first input of the second multiplexer 30 as well as to the line 130 as shown in FIG. 8.

The second multiplexer 30 receives as second input the line 150, and its output is coupled to the line 110. Optionally, the output of the second multiplexer 30 can also be provided as the optional feedback-line 180 coupling to the first input of the third multiplexer 30.

In the following embodiments of FIGS. 2 to 7, different examples of operation modes will be illustrated. While the connections as shown in FIG. 1 can be maintained, the respective signal paths for each operation mode shall be depicted with thick lines. For the sake of simplicity, most of the paths not required for the respective operation mode have been omitted. The respective selection scheme of the multiplexers can be seen from those lines passing through the multiplexers.

Figure 2:
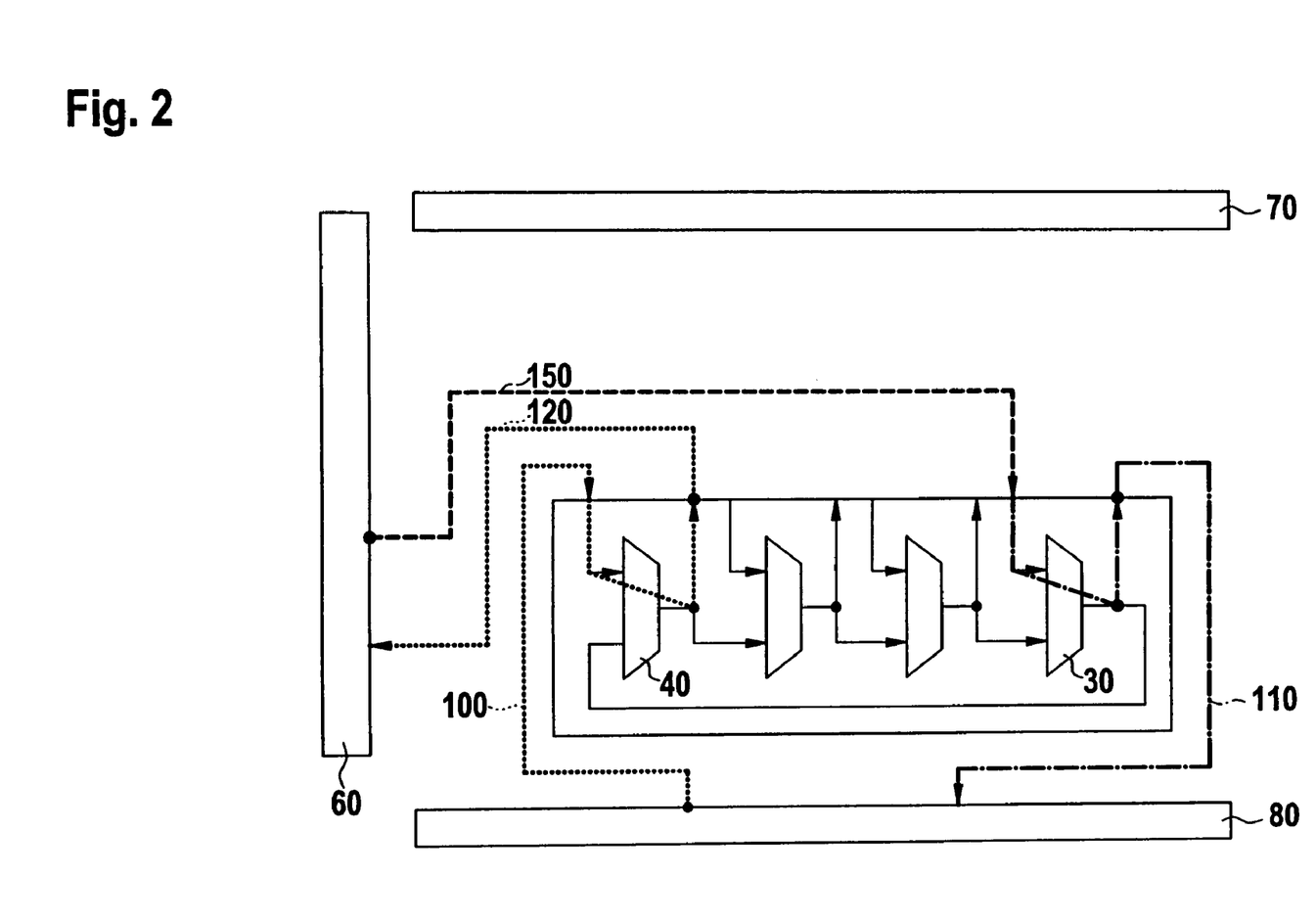
FIGS. 2–8 show further preferred embodiments.

FIG. 2 shows an embodiment wherein the analyzer 65 is embodied as a serial test unit 65 operating in an exerciser mode for exercising the first DUT 85. In that mode, the serial test unit 65 is connected to the DUT 85 through a point-to-point link. It can therefore establish bi-directional communication with DUT 85. This can be used to test DUT 85 independent (or even in the absence) of the DUT 75.

In the embodiment of FIG. 2, the third multiplexer 40 selects the line 100 as its second input to provide its output to the line 120. As mentioned above, in case the third multiplexer 40 is omitted, the line 100 will be directly coupled to the line 120. The second multiplexer 30 selects the line 51 to provide its output as the line 110.

Figure 3:
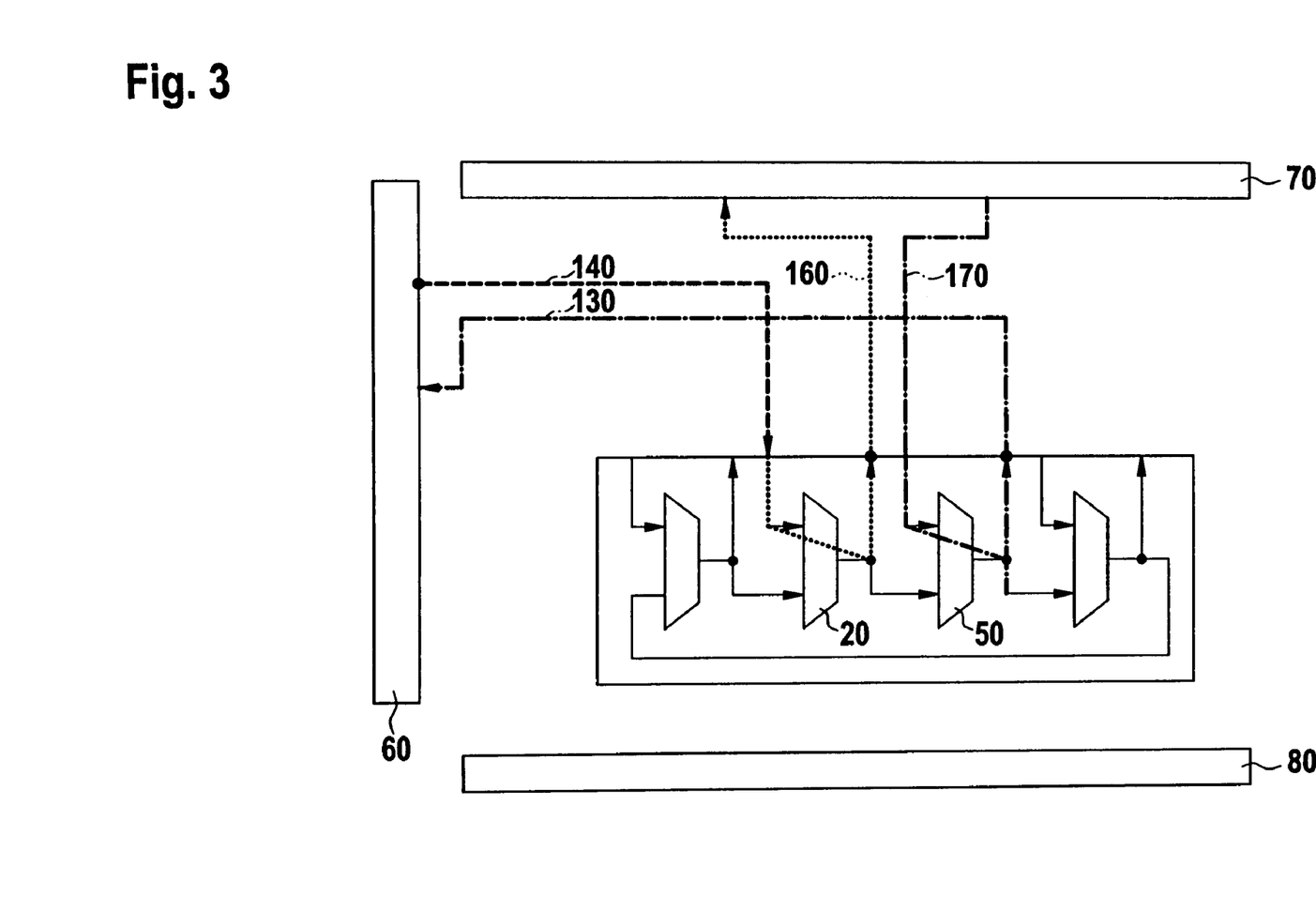

FIG. 3 shows an embodiment wherein the analyzer 65 is also operating in an exerciser mode as illustrated with respect to FIG. 2, however, in this case for exercising the second DUT 75. In FIG. 3, the first multiplexer 20 selects the line 140 to be coupled to the line 160, and the fourth multiplexer 50 selects the line 170 to be coupled to the line 130.

As mentioned above, in case the optional fourth multiplexer 50 is omitted, the line 170 is already coupled to the line 130.

Figure 4:
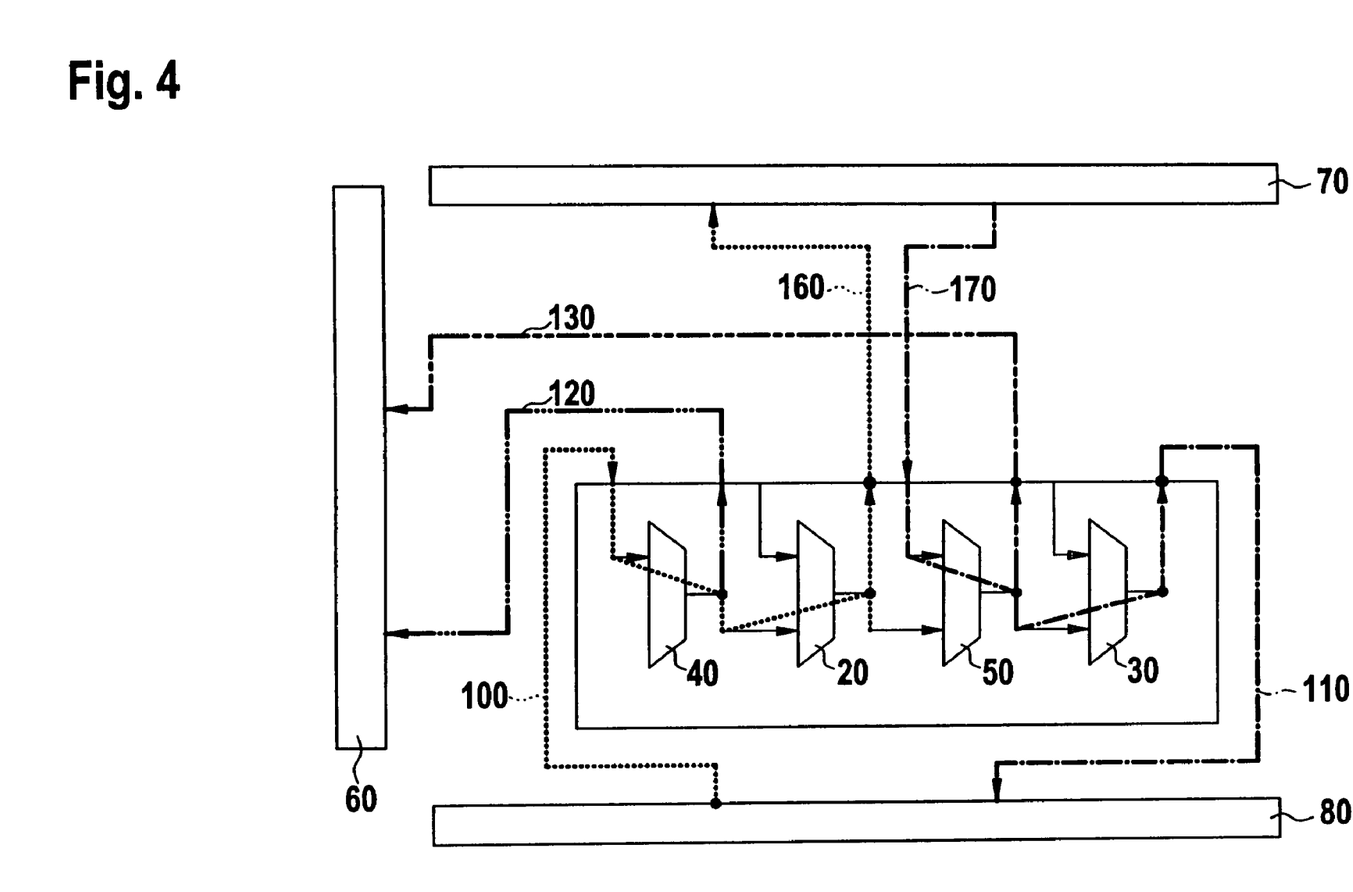

FIG. 4 shows an embodiment wherein the analyzer 65 is operating in an analyzer mode in order to analyze a communication between the first and second DUTs 85 and 75. In this operation mode, the analyzer 65 passively "listens in" on the point-to-point link that exists between the DUT 75 and the DUT 85 and does not influence the connection in any way.

In FIG. 4, the line 100 is coupled to the line 120 as well as to the first input of the first multiplexer 20, either through the optional third multiplexer 40 or by a direct connection. The first multiplexer 20 selects the line 100 at its first input as its output, thus coupling the line 100 to the line 160. The line 170 is coupled to the line 130 as well as to the first input of the second multiplexer 30, either through the optional fourth multiplexer 50 or by direct connection. The second multiplexer 30 selects its first input, thus coupling the line 170 to the line 110. The broken lines 120 and 130 indicate that the analyzer 65 is only "listening" to the communication between the first and second DUTs 85 and 75, whereas the unbroken signals paths between the lines 100 and 160 or 170 and 110 represent the actual communication paths.

Figure 5:
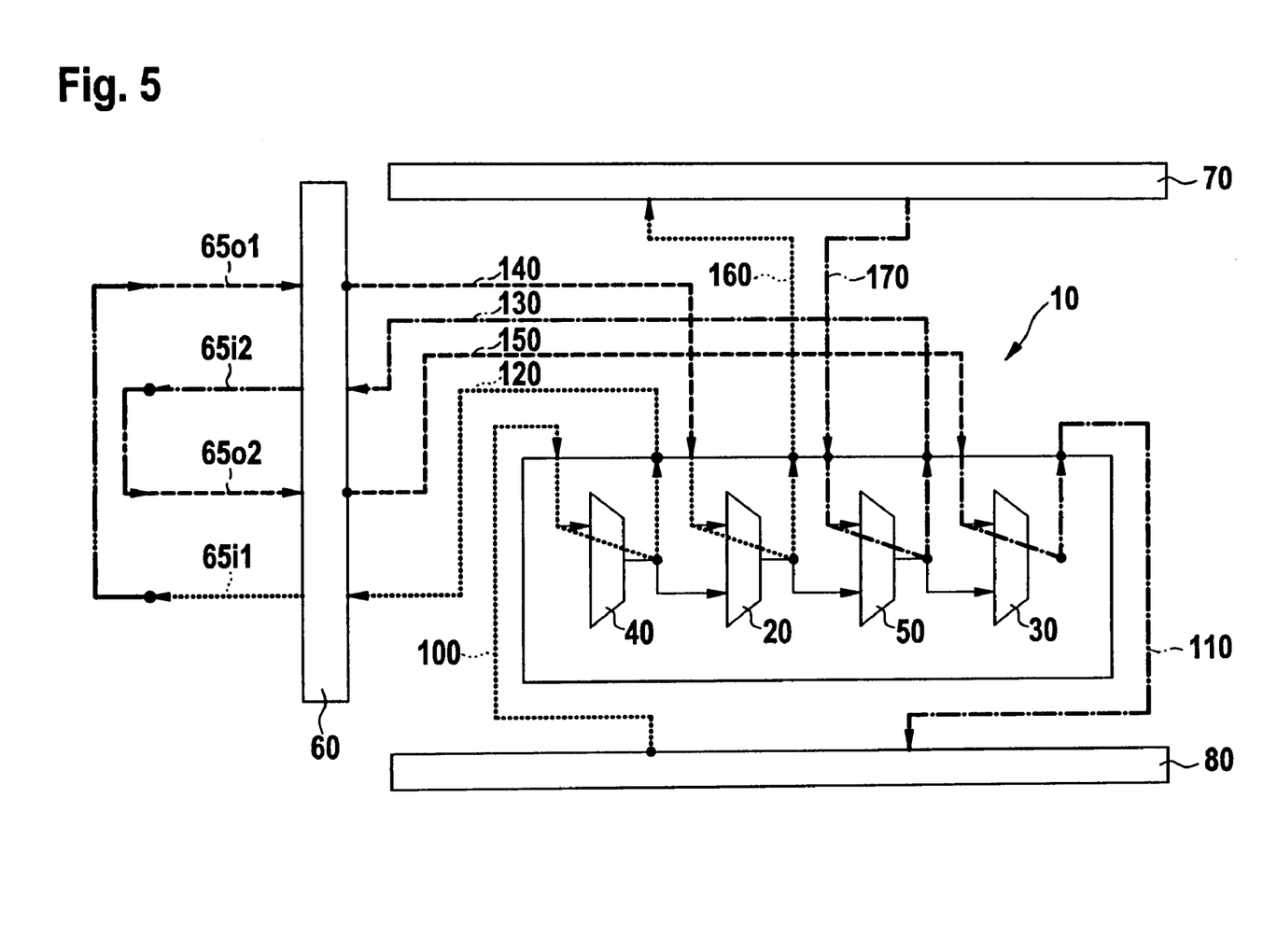

FIG. 5 shows an embodiment wherein the signal analyzer 65 is operating again in an analyzer mode, however, the point-to-point link goes through the serial test unit and thus allows the test unit to manipulate both unidirectional serial links (e.g. re-timing, error-injection, etc.). In FIG. 5, the line 100 is coupled to the line 120, either through the third multiplexer 40 or directly. The first multiplexer 20 selects line 140 to be coupled to the line 160, the line 170 is coupled to the line 130 either through the fourth multiplexer 50 or directly. The second multiplexer 30 selects the line 150 to be coupled to the line 110. Within the signal analyzer 65, the signals received at input 65i1 are analyzed and a corresponding response signal is provided at the output 65o1. Accordingly, signals received at the second input 65i2 are analyzed and a corresponding response signal is provided at the output 65o2.

Figure 6:
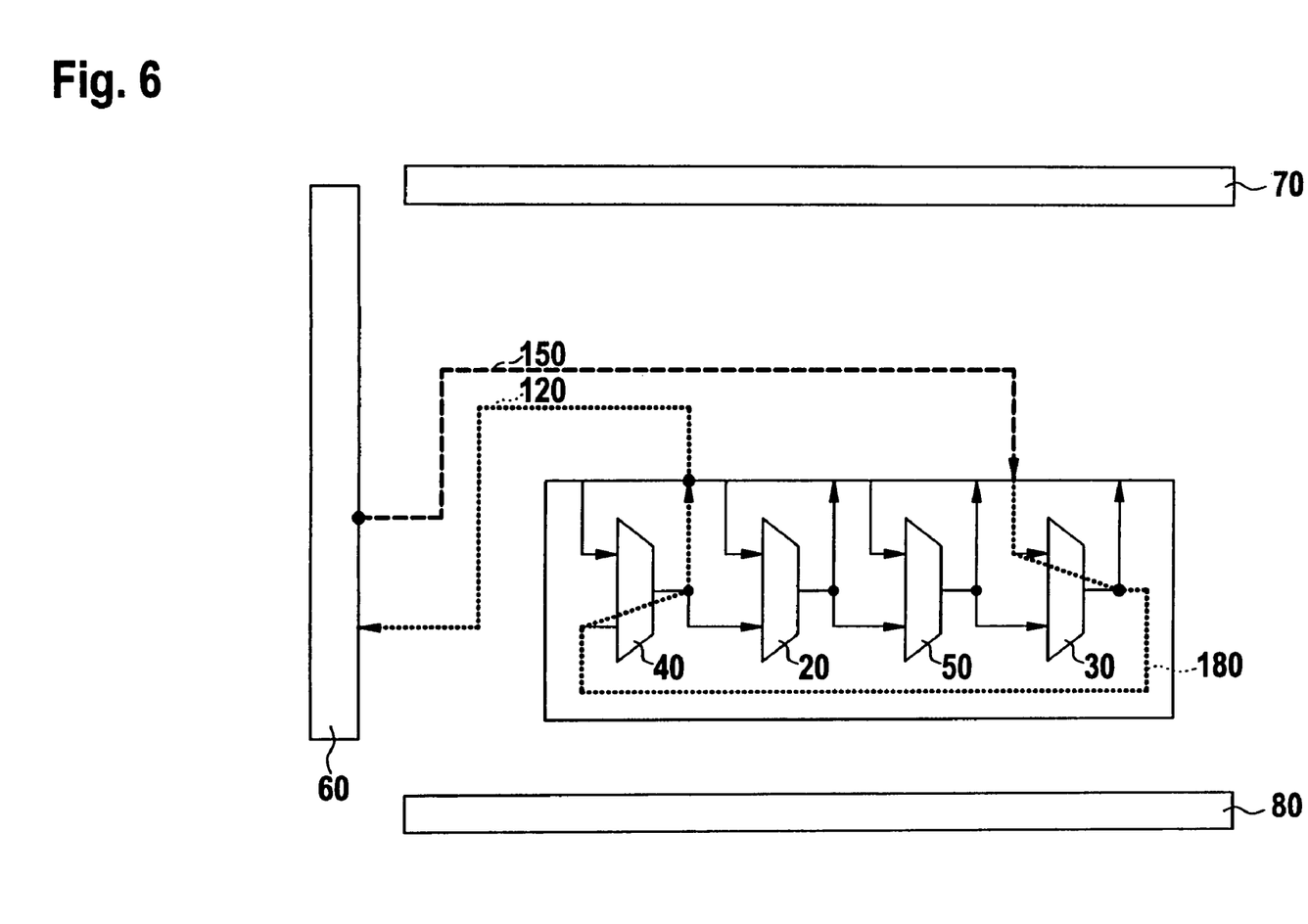

FIG. 6 shows an embodiment wherein the serial test unit 65 is operated in an exerciser loop-back mode in order to perform a self-test of the serial test unit's transmitter and receiver circuits. In FIG. 6, the second multiplexer 30 selects the line 150 at its second input to provide the output, and the feedback line 180 thus couples the line 150 to the first input of the third multiplexer 40. The third multiplexer 40 selects the first input and couples it to the line 120. Thus, line 150 becomes coupled to the line 120.

Figure 7:
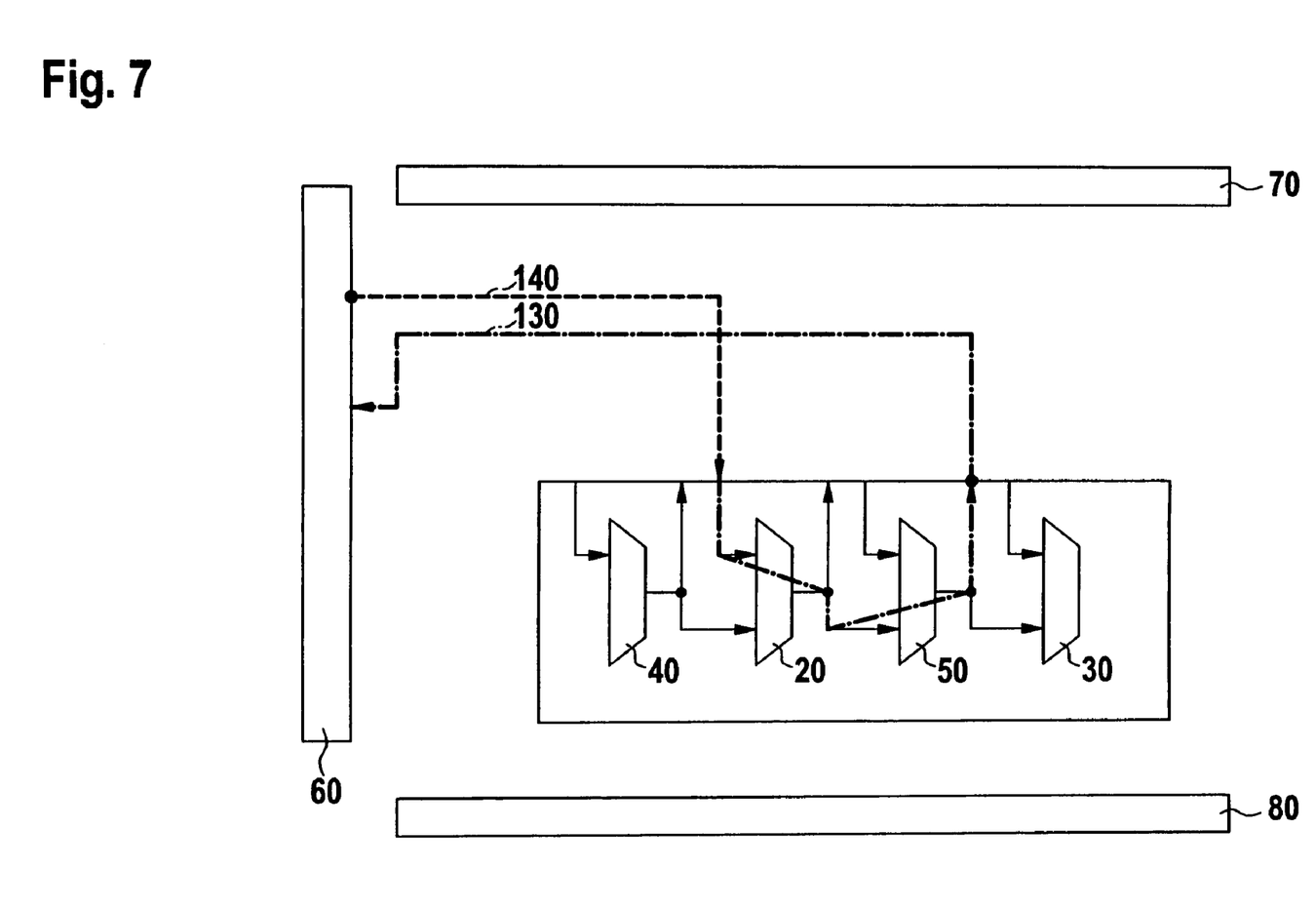

In FIG. 7, the signal analyzer 65 is operated again in an exerciser loop-back mode in order to perform a self-test of the serial test unit's transmitter and receiver circuits. In FIG. 7, the line 140 is selected by the first multiplexer 20 to provide its output and thus coupled to the first input of the fourth multiplexer 50, which selects its first input to provide its output to line 130. Thus, line 140 becomes coupled to the line 130.

As can be seen from the afore described, the inventive connecting of one or two DUTs and a serial test unit through a quad port-bypass circuit offers a variety of applications without re-connecting any of the devices. Preferred applications can be e.g. exercising either one of the DUTs, analyzing the communication between the DUTs, or insertion of errors into the point-to-point link between the DUTs.

It is clear that by coupling further multiplexers in accordance with the aforedescribed, further testing possibilities can be added.

What is claimed is:

1. A coupling unit adapted for providing at least one signal path between at least two of: a first device under test—DUT-, a first coupler, and a second coupler, wherein:
  each signal path is adapted to provide a unidirectional serial communication,
  the first coupler is adapted to be coupled to by a signal analyzer adapted to analyze signals received,
  the first coupler is adapted to receive signals from the coupling unit at one or more inputs and to provide signals to the coupling unit from one or more outputs,
  the second coupler is adapted to be coupled to by a second DUT, and
  the second coupler is adapted to receive signals from the coupling unit at an input and to provide signals to the coupling unit from an output,
the coupling unit comprising a first and a second multiplexer, each adapted for selecting as its output one of its plural inputs, wherein:
  an output of the first DUT is coupled to a first input of the first multiplexer and to a first input of the first coupler,
  a first output of the first coupler is coupled to a second input of the first multiplexer,
  the output of the first multiplexer is coupled to the input of the second coupler,
  the output of the second coupler is coupled to a first input of the second multiplexer and to a second input of the first coupler,
  a second output of the first coupler is coupled to a second input of the second multiplexer,
  the output of the second multiplexer is coupled to an input of the first DUT.

2. The coupling unit of claim 1, wherein the signal analyzer is coupled to the first coupler, and at least one of the following is provided:
  one input of the signal analyzer is coupled to the first input of the first coupler in order to analyze signals received from the output of the first DUT;
  one output of the signal analyzer is coupled to the second output of the first coupler in order to provide signals to the input of the first DUT, wherein the second multiplexer selects its second input as its output.

3. The coupling unit of claim 1, wherein the second DUT is coupled to the second coupler, and at least one of the following is provided:
  one input of the signal analyzer is coupled to the second input of the first coupler in order to analyze signals received from the second DUT coupled to the output of the second coupler;
  one output of the signal analyzer is coupled to the first output of the first coupler in order to provide signals to the device coupled to the input of the second coupler, wherein the first multiplexer selects its second input as its output.

4. The coupling unit of claim 1, wherein:
the second DUT is coupled to the input and the output of the second coupler,
the signal analyzer is coupled to the first coupler in order to analyze signals transmitted between the first DUT and the second DUT, and
at least one of the following is provided:
one input of signal analyzer is coupled to the first input of the first coupler, and the first multiplexer selects its first input as its output, and
another input of signal analyzer is coupled to the second input of the first coupler, and the second multiplexer selects its first input as its output.

5. The coupling unit of claim 1, wherein:
the second DUT is coupled to the input and the output of the second coupler,
the signal analyzer is coupled to the first coupler in order to analyze signals transmitted between the first DUT and the second DUT, and
at least one of the following is provided:
one input of the signal analyzer is coupled to the first input of the first coupler, one output of signal analyzer is coupled to the first output of the first coupler, and the first multiplexer selects its second input as its output, and
another input of the signal analyzer is coupled to the second input of the first coupler, another output of signal analyzer is coupled to the second output of the first coupler, and the second multiplexer selects its second input as its output.

6. The coupling unit of claim 1, wherein the signal analyzer is coupled to the first coupler, and at least one of the following is provided:
one input of the signal analyzer is coupled to the first input of the first coupler, one output of signal analyzer is coupled to the second output of the first coupler, the output of the second multiplexer is coupled to a first input of a third multiplexer, the output of the first DUT is coupled to a second input of the third multiplexer, the third multiplexer selects its first input as its output, and the second multiplexer selects its second input as its output;
another input of the signal analyzer is coupled to the second input of the first coupler, another output of signal analyzer is coupled to the first output of the first coupler, the first multiplexer selects its second input as its output, the output of the first multiplexer is coupled to a first input of a fourth multiplexer, the output of the second coupler is coupled to a second input of a fourth multiplexer, and the fourth multiplexer selects its first input as its output.

7. The coupling unit of claim 1, wherein the signal analyzer is adapted to analyze the received signals in order to execute at least one of:
test and/or verify operation and/or functionality of at least one of the first and the second DUT,
test and/or verify a communication and/or a communication path between the first and the second DUT,
test and/or verify a communication protocol applied in a communication with at least one of the first and the second DUT,
test and/or verify a communication protocol applied in a communication between the first and the second DUT,
provide a response signal in response to the received signals at at least one output of the signal analyzer,
provide a response signal in response to the received signals at at least one output of the signal analyzer, wherein the response signal deviates from an expected or regular response signal to be provided in response to the received signals in order induce an error into the communication.

8. The coupling unit of claim 1, wherein the signal analyzer comprises a signal modification unit adapted to modify signals received and to provide the modified signals at at least one output of the signal analyzer.

9. The coupling unit of claim 1, wherein at least one of the first and second DUT is data processing unit adapted for processing digital data, preferably a computer.

10. A signal tester comprising:
a first and a second coupler,
a coupling unit adapted for providing at least one signal path between at least two of: a first device under test—DUT-, the first coupler, and the second coupler, and
a signal analyzer coupled to the first coupler and being adapted to analyze signals received,
wherein:
each signal path is adapted to provide a unidirectional serial communication,
the first coupler is adapted to be coupled to by the signal analyzer,
the first coupler is adapted to receive signals from the coupling unit at one or more inputs and to provide signals to the coupling unit from one or more outputs,
the second coupler is adapted to be coupled to by a second DUT, and
the second coupler is adapted to receive signals from the coupling unit at an input and to provide signals to the coupling unit from an output,
the coupling unit comprising a first and a second multiplexer, each adapted for selecting as its output one of its plural inputs, wherein:
an output of the first DUT is coupled to a first input of the first multiplexer and to a first input of the first coupler,
a first output of the first coupler is coupled to a second input of the first multiplexer,
the output of the first multiplexer is coupled to the input of the second coupler,
the output of the second coupler is coupled to a first input of the second multiplexer and to a second input of the first coupler,
a second output of the first coupler is coupled to a second input of the second multiplexer,
the output of the second multiplexer is coupled to an input of the first DUT.

* * * * *